United States Patent
Khilchenko et al.

(10) Patent No.: US 7,240,425 B2
(45) Date of Patent: Jul. 10, 2007

(54) METHOD OF MAKING AN ELECTRICAL CONNECTION TO A CONDUCTOR ON AN INNER LAYER OF A MULTI-LAYER PRINTED CIRCUIT BOARD

(75) Inventors: Leon M. Khilchenko, Manchester, NH (US); Mark W. Gailus, Somerville, MA (US)

(73) Assignee: Amphenol Corporation, Wallingford, CT (US)

( * ) Notice: Subject to any disclaimer, the term of this patent is extended or adjusted under 35 U.S.C. 154(b) by 128 days.

(21) Appl. No.: 10/422,515

(22) Filed: Apr. 24, 2003

(65) Prior Publication Data

US 2004/0212972 A1    Oct. 28, 2004

(51) Int. Cl.
*H05K 3/30* (2006.01)

(52) U.S. Cl. .............. 29/837; 29/502; 29/625; 29/626; 29/627; 29/832; 29/842; 29/852; 174/261; 174/262; 174/263; 257/E23.062; 361/790

(58) Field of Classification Search ............. 29/837, 29/502, 625, 626, 627, 832, 852; 361/790; 174/261, 262, 263; 257/E23.062
See application file for complete search history.

(56) References Cited

U.S. PATENT DOCUMENTS

| | | | |
|---|---|---|---|
| 3,673,680 A * | 7/1972 | Tanaka et al. | 29/837 |
| 4,130,344 A | 12/1978 | Lemonde | 350/96.21 |
| 4,252,407 A | 2/1981 | Bubanko et al. | 350/96.21 |
| 4,290,195 A | 9/1981 | Rippere | 29/837 |
| 4,991,060 A * | 2/1991 | Kawakami et al. | 361/778 |
| 5,638,598 A | 6/1997 | Nakaso et al. | 29/852 |
| 6,570,102 B2 * | 5/2003 | Miller et al. | 174/261 |
| 6,585,903 B1 | 7/2003 | Belke, Jr. et al. | |
| 6,593,535 B2 | 7/2003 | Gailus | |
| 6,747,214 B2 | 6/2004 | Goeblmaier et al. | |
| 2001/0035299 A1 | 11/2001 | Achari et al. | 174/255 |

FOREIGN PATENT DOCUMENTS

| | | |
|---|---|---|
| DE | 19608683 | 9/1997 |
| EP | 0 299 136 | 2/1988 |
| EP | 0 459 776 A | 12/1991 |
| EP | 0899842 | 3/1999 |
| JP | 08 129116 A | 9/1996 |
| JP | 08 248270 A | 1/1997 |
| JP | 10 048477 A | 4/1998 |

* cited by examiner

*Primary Examiner*—A. Dexter Tugbang
*Assistant Examiner*—Tim Phan
(74) *Attorney, Agent, or Firm*—Blank Rome, LLP.

(57) ABSTRACT

What is provided is a multi-layer PCB having a plurality of stacked dielectric layers, a conductor disposed on at least one of the plurality of dielectric layers, and a non-conductive via extending through at least a portion of the plurality of dielectric layers to intersect the conductor. A conductive body in an activated state is introduced into the non-conductive via, and upon contacting the conductor, the activated state conductive body adheres to the conductor. The activated state conductive body is then effected to a deactivated state, wherein the conductive body is affixed to the conductor to provide an electrical connection thereto.

6 Claims, 6 Drawing Sheets

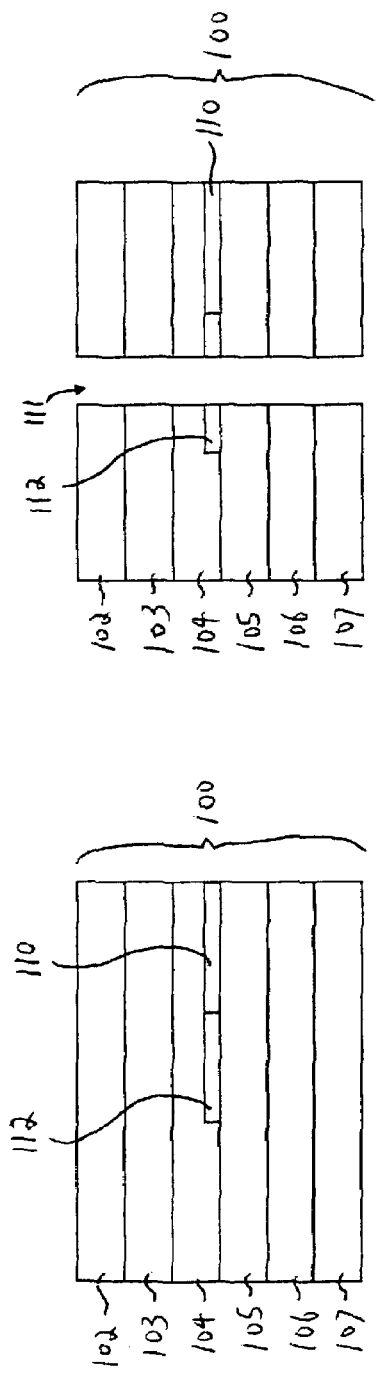
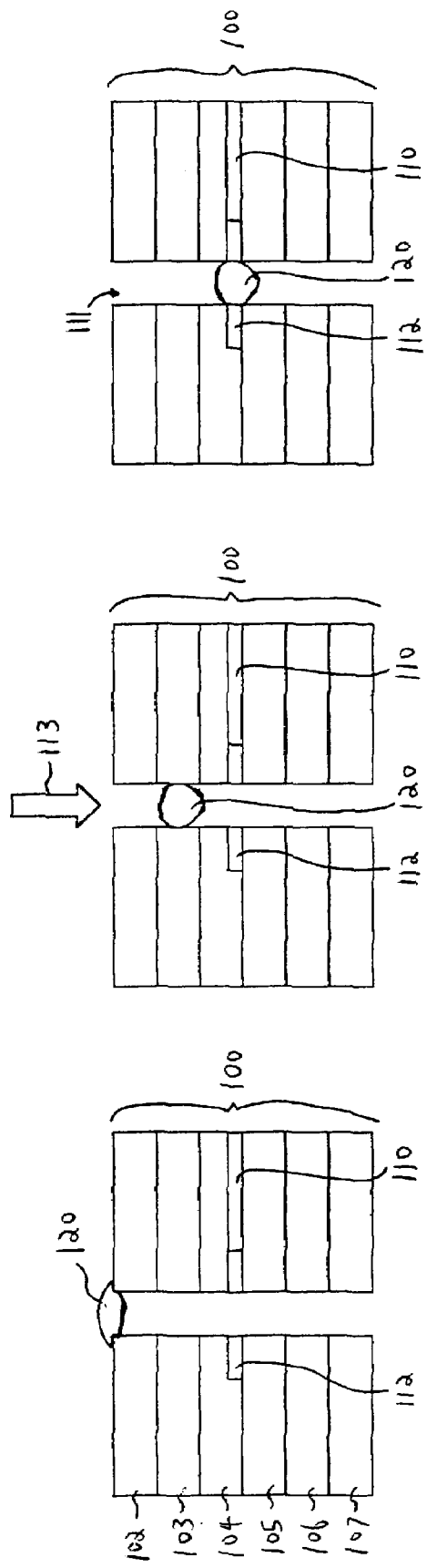

METHOD OF MAKING AN ELECTRICAL CONNECTION TO A CONDUCTOR ON AN INNER LAYER OF A MULTI-LAYER PRINTED CIRCUIT BOARD

BACKGROUND OF THE INVENTION

This invention relates generally to printed circuit boards and more specifically to high speed printed circuit boards that minimize undesirable signal reflections in a via.

As is known in the art, conductive traces are formed on a printed circuit board ("PCB") for carrying data signals and power between components mounted on the board. Space considerations often require the use of multi-layer PCBs including multiple layered dielectric substrates with conductive traces or planes formed on each substrate. The layered substrates are held together to make a PCB that has conductive traces on different levels within the board.

In order to interconnect conductive traces on different layers, conductive vias extend between layers of the multi-layer PCB. For this purpose, conductive vias intersect vertically aligned pads joined to conductive traces on different layers. Conductive vias also interconnect components mounted on the board to conductive traces on inner layers of the board. More particularly, a contact of the component, such as a press-fit pin, makes contact with the conductive walls of the via and the conductive walls of the via, in turn, contact one or more pads of conductive traces on inner layers of the board. Vias which extend through all layers of a multi-layer board are sometimes referred to as through-holes.

Conductive vias are usually formed after the layered substrates are formed into a board. The vias are typically formed by drilling holes through at least a portion of the board and plating the walls of the holes with a conductive material, such as copper. Typically, a thin layer of copper is applied by an electroless process. An electrical potential is connected to this thin layer of copper and a thicker layer of copper is deposited over the thin layer by an electrolytic deposition process. In order to ensure reliable plating of the via walls, the aspect ratio of the printed circuit board thickness to the via diameter is limited. For example, for a PCB having a thickness on the order of 0.25 inches (6.35 mm), the diameter of a plated via must be on the order of at least 0.018 inches (0.46 mm) requiring the hole to be on the order of 0.020 inches (0.51 mm) for plating thickness on the order of 0.002 inches (0.05 mm). This minimum via diameter limits the number of vias that can be provided in a given circuit board area.

An illustrative multi-layer PCB 10 having a conductive via (plated through-hole) 14 as known in the art is shown in FIG. 1. The printed circuit board 10 includes dielectric layers 12a, 12b, and 12c, with a conductive trace 16 formed on layer 12b. In this example, a three layer PCB is shown. The conductive via 14 extends through a pad 17 of signal trace 16 in order to electrically interconnect to the signal trace 16. A pin 26 of a component 28 inserted at least partially into the conductive via 14 contacts the conductive walls of the via and thus, is electrically connected to signal trace 16.

One of the disadvantages associated with utilization of conductive vias relate to signal quality at high data rates. For example, portions of a conductive via extending beyond the inner layers of the board which are interconnected to other layers and/or to a component mounted on the board, such as portion 20 of via 14, can act as a resonant stub, causing undesirable signal reflections at certain frequencies.

A solution to this problem is to use "blind" or buried vias for interconnecting traces on inner layers of a PCB. A blind via extends from the surface of a board through only a portion of the layers of a multi-layer PCB. Buried vias are used to interconnect two interior layers of the printed circuit board. Buried vias are formed by first making a subassembly from one or more layers of the PCB. A hole is drilled through these layers and the hole is plated. Additional substrate layers are added to the top and the bottom of the subassembly to make a complete PCB. The resulting buried vias are inaccessible and increase the manufacturing complexity of the multi-layer PCB.

An alternative technique for eliminating resonant stubs formed by portions of conductive vias is to remove the stub portions of the via by drilling them out of the board. For example, by drilling a hole through layers 12b and 12c concentrically around, and with a larger diameter than the via 14, the via portion 20 extending through layers 12b and 12c is removed. However, this technique requires additional manufacturing steps that add undesirable cost and complexity.

Still another solution provided for eliminating resonant stubs formed by portions of conductive vias is shown in FIG. 2. This drawing is FIG. 3 of U.S. application Ser. No. 09/892,045, now U.S. Pat. No. 6,593,535, issued Jul. 15, 2003, that is entitled "Direct Inner Layer Interconnect For A High Speed Printed Circuit Board" and assigned to the assignee of the present invention. A multi-layer PCB 30 having dielectric layers 34, 36, 38 and 40 is illustrated. At least one of the dielectric layers has a conductive trace 44 formed thereon for carrying a high speed signal. The conductive trace 44 includes a pad 44a to facilitate electrical connection to the trace 44.

Unlike the other prior art solutions described above, FIG. 2 shows a non-conductive via 54 in the form of a non-plated hole extending through at least a portion of the dielectric layers 34–40 to intersect the conductive trace 44. A conductive element 60, such as a contact of an electrical component (e.g., connector or integrated circuit), is designed to be press-fit into the non-conductive via 54 to make electrical contact with the pad 44a of the trace 44. While this solution offers advantages, it does require manufacturing and design steps to ensure that the conductive element 60 makes satisfactory electrical contact with the desired conductive trace of the PCB. Also, where two inner traces of the PCB are desired to be electrically connected to the conductive element 60, additional steps and complexities are added.

What is desired, therefore, is an easily manufactured structure for making reliable electrical connection to a conductive trace on an inner layer of a multi-layer PCB that minimizes undesirable signal reflections due to resonant stubs.

SUMMARY OF THE INVENTION

It is an object of the invention to minimize undesirable signal reflections caused by resonant stub portions of conductive vias in a multi-layer PCB.

It is another object of the invention to provide an easily manufactured structure for making reliable electrical connection to a conductive trace on an inner layer of a multi-layer PCB.

It is a further object of the invention to increase the component density achievable with a multi-layer PCB.

It is still another object of the invention to provide a multi-layer PCB capable of improved aspect ratios.

These and other objects of the invention are achieved in one embodiment by a multi-layer PCB having a plurality of stacked dielectric layers, a conductor disposed on at least one of the plurality of dielectric layers, and a non-conductive via extending through at least a portion of the plurality of dielectric layers to intersect the conductor. A conductive body in an activated state is introduced into the non-conductive via, and upon contacting the conductor, the activated state conductive body adheres to the conductor. The activated state conductive body is then effected to a deactivated state, wherein the conductive body is affixed to the conductor to provide an electrical connection thereto.

Because the via does not have conductive plating, resonant stubs are not formed. A further advantage of the non-conductive via is that two conductive elements, such as contacts of two different electrical components, can be inserted into a single non-conductive via from opposite sides of the board in order to make direct electrical connection between the components and conductive traces on inner layers of the board. In this way, the circuit board density could be increased.

BRIEF DESCRIPTION OF THE DRAWINGS

The foregoing features of this invention, as well as the invention itself, may be more fully understood from the following description of the drawings in which:

FIGS. 4A–4E illustrate the process steps that result in the multi-layer PCB of FIG. 3, where FIG. 4A is a partial cross-sectional view of a multi-layer PCB having a conductor on an inner layer;

FIG. 4B is a partial cross-sectional view of the multi-layer PCB of FIG. 4A with a non-conductive via intersecting the conductor formed in the PCB;

FIG. 4C is a partial cross-sectional view of the multi-layer PCB of FIG. 4B with an activated state conductive body being introduced into the non-conductive via;

FIG. 4D is a partial cross-sectional view of the multi-layer PCB of FIG. 4C with the activated state conductive body migrating in the direction of the conductor;

FIG. 4E is a partial cross-sectional view of the multi-layer PCB of FIG. 4D with the conductive body adhering to the conductor;

DETAILED DESCRIPTION OF THE PREFERRED EMBODIMENT

Figure 1:
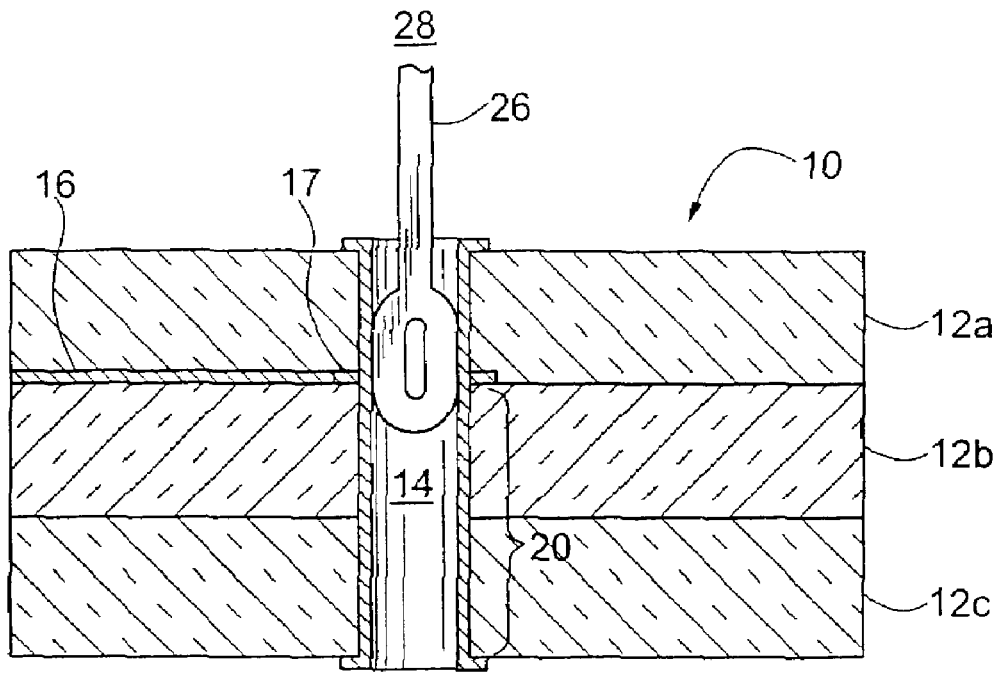
FIG. 1 is a partial cross-sectional view of a conventional multi-layer PCB having a conductive via.
Figure 2:
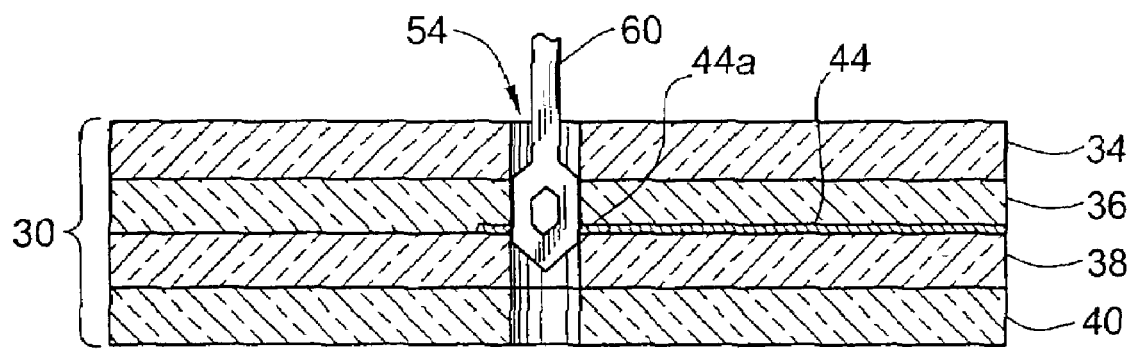
FIG. 2 is a partial cross-sectional view of a multi-layer PCB having a non-conductive via as shown in FIG. 3 of U.S. application Ser. No. 09/892,045.
Figure 3:
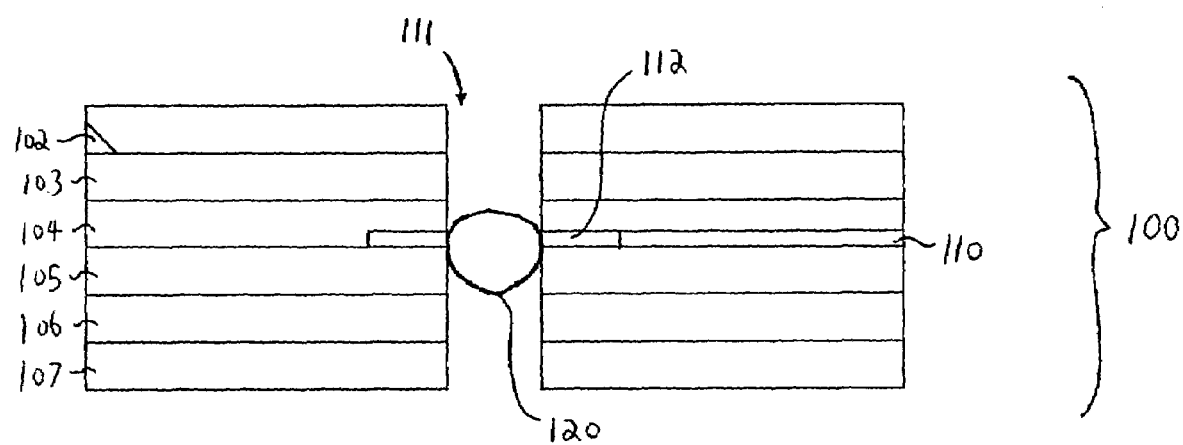
FIG. 3 is a partial cross-sectional view of a multi-layer PCB having a conductor disposed on an inner layer with a non-conductive via intersecting the conductor and a conductive body attached to the conductor, in accordance with the present invention.

FIG. 3 is a partial cross-sectional view of a multi-layer printed circuit board 100 in accordance with the present invention. The multi-layer PCB 100 includes dielectric layers 102–107, with at least one of the dielectric layers having a conductive trace 110 formed on a surface in a conventional manner, such as by photolithography. The conductive trace 110 is adapted for carrying a high speed signal and has a conductive pad 112 connected thereto for facilitating electrical connection to the conductive trace 110.

A non-conductive via 111 in the form of a non-plated hole extends through at least a portion of the dielectric layers 102–107 to intersect at least one conductive trace on an inner layer of the PCB 100. In the illustrative embodiment of FIG. 3, the non-conductive via 111 extends through the entire PCB 100 and intersects the conductive pad 112 of the conductive trace 110, thereby exposing a portion of the pad 112 along the walls of the non-conductive via 111.

As will be described in greater detail with respect to FIGS. 4A–4E and 5, a conductive body 120 is introduced into the non-conductive via 111 and attaches to the exposed portion of the pad 112 to provide a reliable electrical connection between an electrical component 130 mounted on the PCB 100 and the conductive trace 110. With this arrangement, electrical connection between the component 130, such as a connector or an integrated circuit, and an inner layer conductor 110 is achieved with a non-conductive via 111 which does not have plated via portions that can form a resonant stub.

Note that each of the dielectric layers 102–107 of the multi-layer PCB 100 can be fabricated by conventional techniques. As one example, one or more of the dielectric layers 102–107 is made of fiberglass-reinforced epoxy resin with copper cladding. The copper is photolithographically processed to form a desired circuit pattern of conductive traces and pads on the surface of the layer. The individually processed layers 102–107 are stacked and pressed into the printed circuit board 100 by known techniques. This is shown in FIG. 4A, where the conductive trace 110 and the pad 112 are formed on the dielectric layer 104 (or dielectric layer 105) of the PCB 100.

Referring now to FIG. 4B, a hole is drilled in the PCB 100, as may be done by a conventional drill bit, by using laser drilling, by water jet drilling or other techniques, in order to form the non-conductive via 111. Note that it may be desirable to remove the insulator material of the layers 102–107 that may be spread along the walls of the via hole 111 during drilling, at least in the vicinity of the inner layer conductor 110. Various techniques are suitable for this purpose, including plasma and chemical etching. As one example, the epoxy resin material of the layers is removed from the walls by a known cleaning process, such as a chemical reduction process using potassium permanganate. Removing resin in the vicinity of the inner layer conductor serves to expose some of the trace 110 and may leave a small tab of the trace sticking into the via hole 111. Such a tab would be engaged by the conductive body 120 when it is introduced into the non-conductive via 111, thereby resulting in a better electrical connection.

FIG. 4C is a partial cross-sectional view of the multi-layer PCB 100 of FIG. 4B with a conductive body 120 being introduced into the non-conductive via 111. The conductive body 120 may be made from a fusible alloy, a conductive adhesive or other material that provides the desired characteristics described herein. In the preferred embodiment, the conductive body 120 is made from powdered solder in liquid flux (also referred to as solder paste).

The conductive body 120 is introduced into the non-conductive via 111 in an activated state. As used herein, "activated state" refers to the conductive body in an uncured or liquid or other form to allow the conductive body to migrate. In FIG. 4D, the activated state conductive body 120 is shown being effected to migrate in the direction of the conductor 110. Arrow 113 indicates the direction of migration of the activated state conductive body 120. The migration of the conductive body 120 can be caused by action of gravity, heat, or other external means known in the art.

When the activated state conductive body makes contact with the pad 112 of the conductive trace 110, it adheres to the pad 112. It appears to the inventors that this is due to the action of surface tension. Based on experiments performed by the inventors using solder paste as the material for the conductive body, the activated state conductive body remains adhered to the pad even if the external influence (e.g., gravity) is not abated for some time after the activated state conductive body has come into contact with the pad. Thus, an added benefit of the present invention is that this characteristic accommodates variabilities inherent in the process and the materials.

After the activated state conductive body 120 adheres to the pad 112, the activated state conductive body is effected to a deactivated state to affix the conductive body 120 to the pad 112. "Affix" as used herein is not intended to convey a sense of physical permanence in attachment but rather, is only intended to convey a sense of better attachment or adhesion of the conductive body to the pad than when the conductive body is in an activated state. FIG. 4E illustrates the conductive body 120 adhering to the pad 112. Note that the conductive body 120 in the non-conductive via 111 of FIGS. 3 and 4 is generally spherical in shape (with meniscus created by surface tension). However, the shape of the conductive body is not limited to a generally spherical form. As will be described with respect to FIG. 6, the conductive body can also assume a generally oval (or perhaps, rounded rectangle) form.

Figure 5:
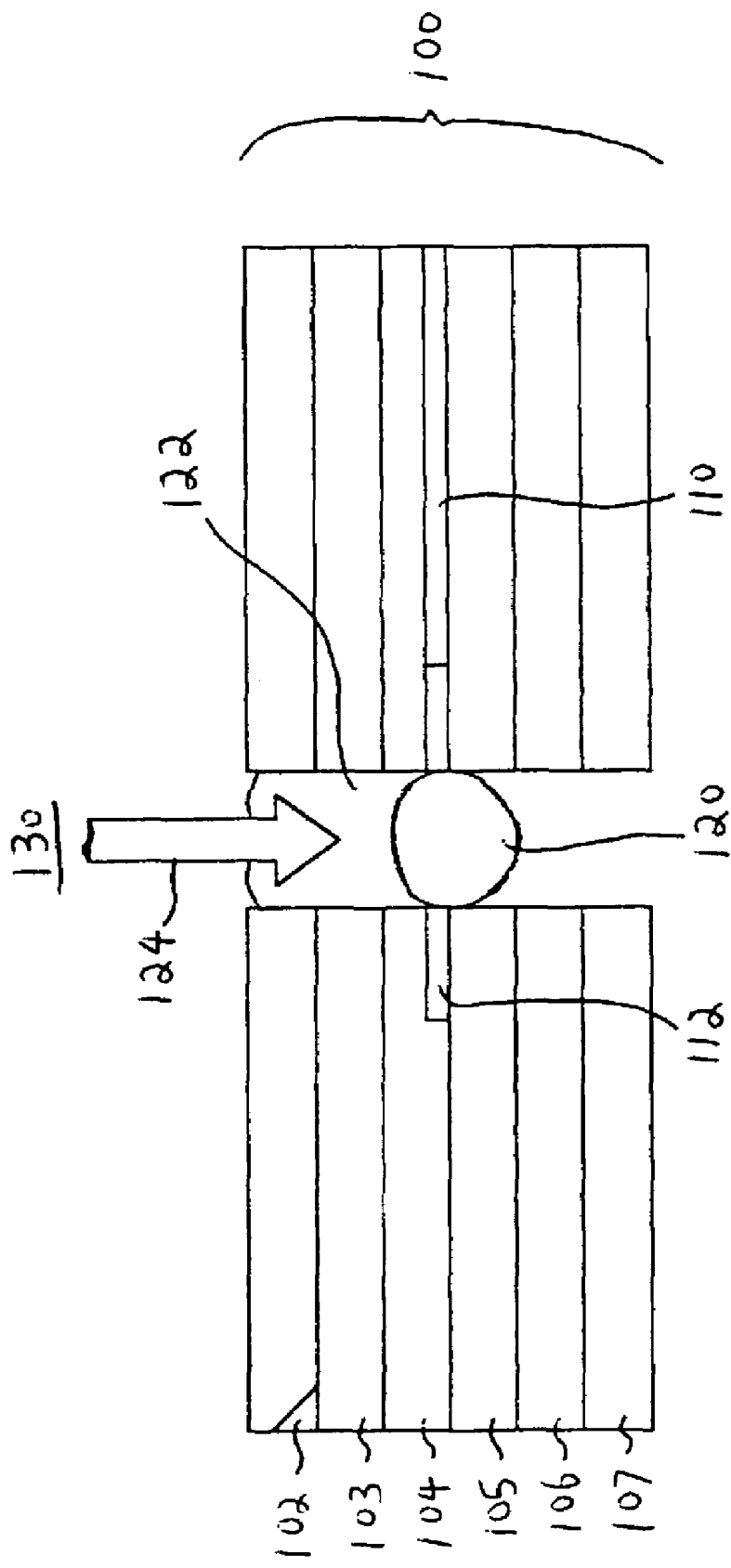
FIG. 5 is a partial cross-sectional view of the multi-layer PCB of FIG. 3 with a conductive material and a contact of an electrical component in electrical connection with the conductive body, in accordance with the present invention.

Referring now to FIG. 5, following the affixing of the conductive body 120 to the pad 112 of the conductor 110, an activated state conductive material 122 is introduced into the non-conductive via 111. The conductive material 122 may be made from a fusible alloy, a conductive adhesive or other material that provides the desired characteristics described herein. In the preferred embodiment, the conductive material 122 is made from solder paste. The conductive material 122 may be disposed directly onto the conductive body 120 or may be effected to move in the direction of the conductor 110. If effected to migrate, the migration of the conductive material 122 can be caused by action of gravity, heat, or other external means known in the art. The activated state conductive material 122 will migrate until it makes contact with the conductive body 120.

A conductive element, such as a contact pin 124 of the electrical component 130, is introduced into the non-conductive via 111 so that the conductive element makes an electrical connection with the conductive material 122. Preferably, the conductive element 124 is introduced into the non-conductive via 111 with the conductive material 122 in the activated state. After the electrical component 130 is mounted on the PCB 100, the conductive material 122 is effected to a deactivated state.

In order to repair or replace the conductive element 124 of the electrical component 130, the conductive material 122 is subjected to an external factor, such as the application of heat, to allow the conductive element 124 to be removed from the conductive material 122. For example, where the conductive material used is solder paste, the application of heat will soften the solder paste to allow the conductive element 124 to be removed from the non-conductive via 111.

Multi-layer PCBs generally include many vias—sometimes hundreds. It is within the scope of the invention that a PCB, such as the PCB 100, includes both non-conductive vias and conventional plated vias or through-holes. Non-conductive vias might be drilled after conventional plated through-holes are drilled and plated. Alternatively, the non-conducting vias might be masked off during the electroless deposition process step to ensure that no conductive material builds up on the inside walls of the holes.

It should be noted that in an alternative embodiment (not illustrated), the activated state conductive material 122 may be disposed directly into the non-conductive via to make electrical contact with the pad 112 of the conductor 110. No conductive body 120 would need to be first introduced into the non-conductive via. This alternative embodiment may be preferable when the non-conductive via does not extend through the entire thickness of the PCB.

Figure 6:
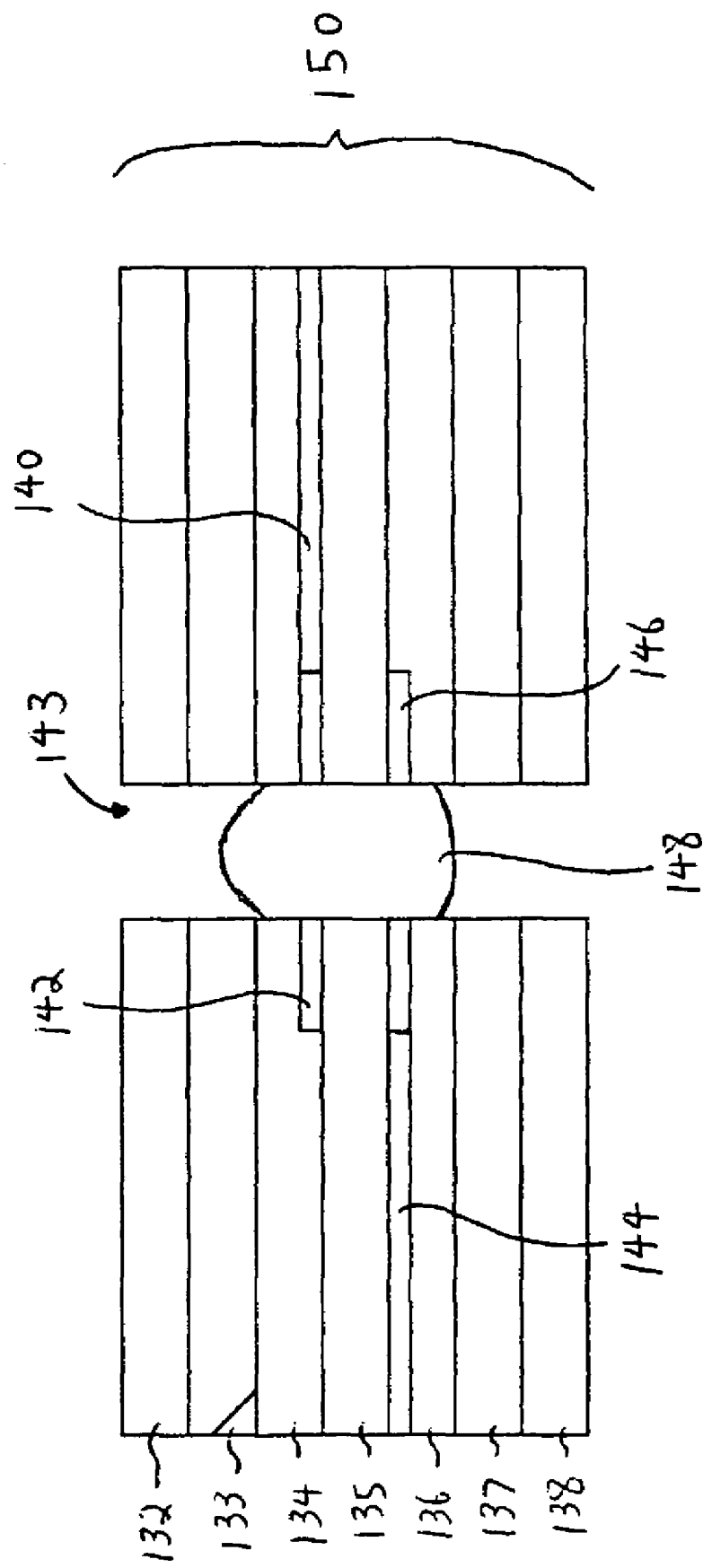
FIG. 6 is a partial cross-sectional view of a multi-layer PCB having two conductors disposed on separate inner layers with a non-conductive via intersecting both conductors and a conductive body attached to both conductors, in accordance with the present invention.

FIG. 6 is a partial cross-sectional view of a multi-layer printed circuit board 150 in accordance with another embodiment of the present invention. The multi-layer PCB 150 includes dielectric layers 132–138, with at least two of the dielectric layers having a conductive trace 140, 144 formed thereon. The conductive traces 140, 144 are adapted for carrying high speed signals and have conductive pads 142, 146 connected respectively thereto.

A non-conductive via 143 in the form of a non-plated hole extends through at least a portion of the dielectric layers 132–138 to intersect the conductive traces 140, 144 on the inner layers of the PCB 150. In the illustrative embodiment of FIG. 6, the non-conductive via 143 extends through the entire PCB 150 and intersects the conductive pads 142, 146 of the conductive traces 140, 144, respectively, thereby exposing a portion of the pads 142, 146 along the walls of the non-conductive via 143.

A conductive body 148 is introduced into the non-conductive via 143 and attaches to the exposed portion of the pads 142, 146. Compared to the generally spherical conductive body 120 in FIG. 3, the conductive body 148 in FIG. 6 is much more elongated in shape (oval or rounded rectangle). This is caused by controlling the amount of the conductive body being introduced into the non-conductive via relative to the size of the via. The arrangement of FIG. 6 is desirable where the conductors 140, 144 are desired to be in electrical contact with one another.

Figure 7:
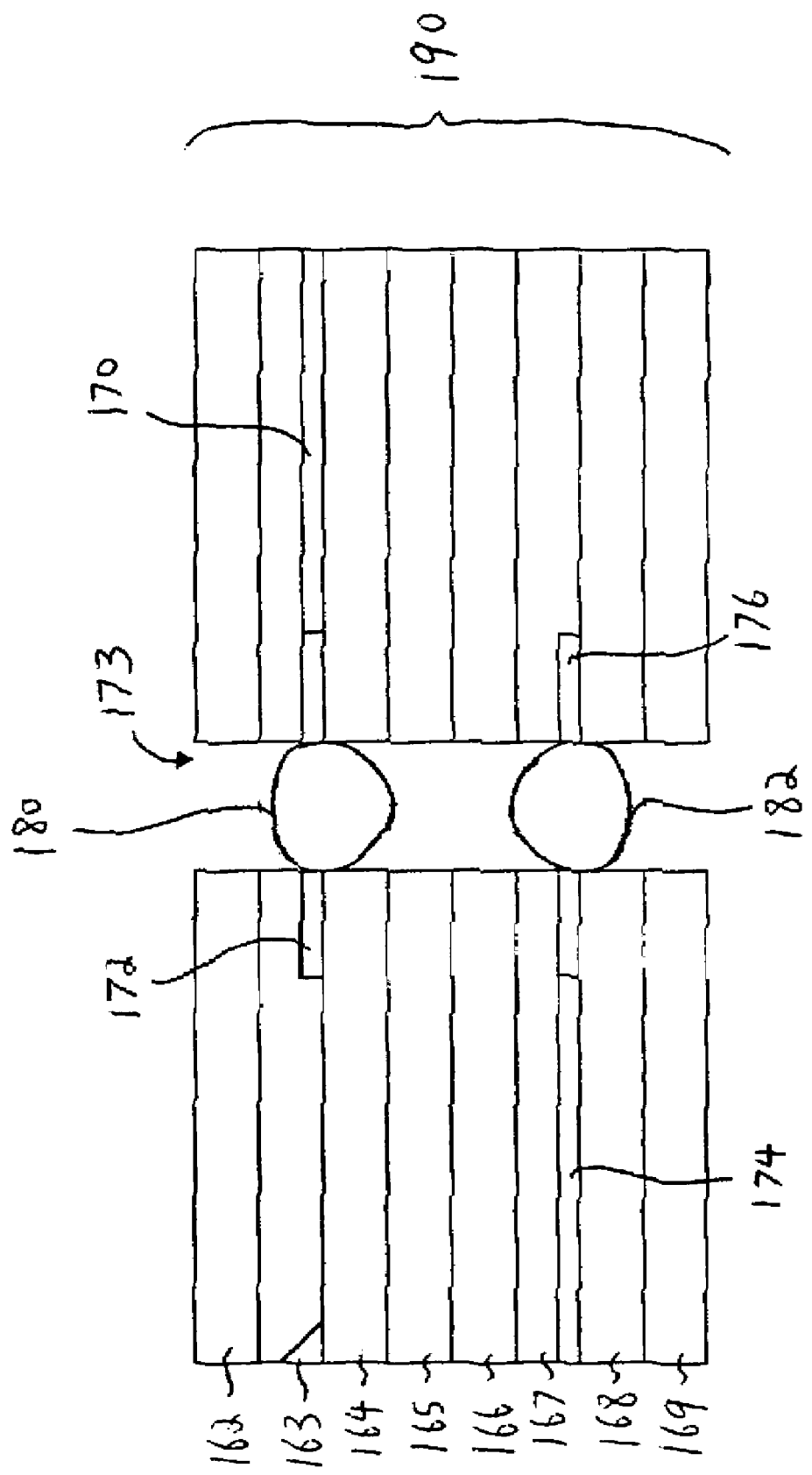
FIG. 7 is a partial cross-sectional view of a multi-layer PCB having two conductors disposed on separate inner layers with a non-conductive via intersecting both conductors and a separate conductive body attached to each conductor, in accordance with the present invention.

Referring now to FIG. 7, there is shown a partial cross-sectional view of a multi-layer PCB 190 in accordance with still another embodiment of the present invention. The multi-layer PCB 190 includes dielectric layers 162–169, with at least two of the dielectric layers having a conductive trace 170, 174 formed thereon. The conductive traces 170, 174 are adapted for carrying high speed signals and have conductive pads 172, 176 connected respectively thereto.

A non-conductive via 173 in the form of a non-plated hole extends through at least a portion of the dielectric layers 162–169 to intersect the conductive traces 170, 174 on the inner layers of the PCB 190. In the illustrative embodiment of FIG. 7, the non-conductive via 173 extends through the entire PCB 190 and intersects the conductive pads 172, 176 of the conductive traces 170, 174, respectively, thereby exposing a portion of the pads 172, 176 along the walls of the non-conductive via 173.

Conductive bodies 180, 182 are introduced into the non-conductive via 173 and attach to the exposed portion of the pads 172, 176, respectively. Preferably, the conductive bodies 180, 182 are introduced from opposite ends of the non-conductive via 173. The arrangement of FIG. 7 provides for greater circuit board density, as an electrical component can be mounted on either end of the non-conductive via 173. It should be noted that rather than a single through-hole 173, two non-conductive vias drilled on opposite sides of the PCB can also function in a similar manner. However, this approach will add process steps.

It should be appreciated that the number of layers of the illustrated multi-layer printed circuit boards is selected for simplicity of illustration and is not a limitation on the invention. However, the invention will be most useful with thicker boards carrying high speed signals. For example, a 3 Gigabits per second digital signal has significant frequency components in the range of 0 to 6 GHz. A stub 5 mm long in an FR-4 epoxy resin/glass PCB will act as a quarter wavelength stub at approximately 6 to 7 GHz. The reflective characteristics of this resonance extend for a band above and below this frequency of at least +/−1 GHz. Thus, a 5 mm stub creates a noticeable problem at rates of 4 Gigabits per second and an extreme problem at rates of between 5 and 10 Gigabits. Of course, at higher frequencies, proportionately shorter stubs will cause problems. Thus, the invention will typically be used in applications in which high speed signals of greater than approximately 2.5 Gigabits per second are carried by boards.

Having described the preferred embodiment of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. A method of making an electrical connection to a conductor on an inner layer of a multi-layer printed circuit board having a non-conductive via through at least a portion of the multi-layer printed circuit board, the non-conductive via intersecting the conductor on the inner layer, the method comprising:

introducing a conductive body at one end of the non-conductive via, the conductive body having an activated state within the non-conductive via;

causing the conductive body in the activated state to migrate in the direction of the conductor whereby the conductive body is spaced from the end and adheres to the conductor upon contact thereto; and deactivating the conductive body from the activated state whereby the conductive body affixes to the conductor to provide an electrical connection to the conductor.

2. The method of claim 1, further comprising introducing a conductive material into the non-conductive via after the conductive body is affixed to the conductor, the conductive material providing an electrical connection to the conductive body.

3. The method of claim 2, wherein introducing a conductive material comprises introducing a contact of an electrical component into the non-conductive via, the contact electrically connecting to the conductive material.

4. The method of claim 1, wherein:
   the multi-layer printed circuit board comprises a second conductor on a second inner layer;

causing the conductive body to migrate further comprises causing the conductive body to adhere to the second conductor; and deactivating the conductive body forms an electrical connection between the conductor and the second conductor.

5. The method of claim 1, wherein the conductive body in the activated state migrates down the non-conductive via.

6. The method of claim 1, wherein the conductive body is spaced apart from two ends of the non-conductive via.

* * * * *